United States Patent [19]

Wellerdieck

[11] Patent Number: 5,064,522
[45] Date of Patent: Nov. 12, 1991

[54] FEED THROUGH FOR APPLICATION OF HF ENERGY

[75] Inventor: Klaus Wellerdieck, Buchs, Switzerland

[73] Assignee: Balzers Aktiengesellschaft, Balzers, Liechtenstein

[21] Appl. No.: 431,871

[22] Filed: Nov. 6, 1989

[30] Foreign Application Priority Data

Nov. 7, 1988 [CH] Switzerland .................. 4122/88

[51] Int. Cl.$^5$ .................. C23C 14/00; C23F 1/02
[52] U.S. Cl. .................. 204/298.28; 204/298.08; 204/298.15; 204/298.34; 118/723; 118/730; 156/345
[58] Field of Search ............ 204/298.08, 298.15, 204/298.28, 298.34; 118/730, 723; 333/24 C; 156/345

[56] References Cited

U.S. PATENT DOCUMENTS

| | | | |
|---|---|---|---|
| 2,555,154 | 5/1951 | Raymond | 333/24 C |
| 2,572,970 | 10/1989 | Baker et al. | 333/261 |
| 2,602,118 | 7/1952 | Adams et al. | 333/24 C |
| 3,013,225 | 12/1961 | Ouchi | 333/24 R |
| 4,170,541 | 10/1979 | Lamont | 204/298.28 |
| 4,269,137 | 5/1981 | Johnson | 204/298.34 |
| 4,526,644 | 7/1985 | Fujiyama et al. | 118/730 |
| 4,557,819 | 12/1985 | Meacham et al. | 204/298.08 |
| 4,704,301 | 11/1987 | Bauer et al. | 204/298.34 |
| 4,714,594 | 12/1987 | Mircea | 118/730 |

FOREIGN PATENT DOCUMENTS 852026 1/1940 France.
1191485 10/1959 France.

*Primary Examiner*—John Niebling
*Assistant Examiner*—Steven P. Marquis
*Attorney, Agent, or Firm*—Notaro & Michalos

[57] ABSTRACT

To supply high-frequency energy to a workpiece support (5) which rotates in a vacuum chamber (3), a cylindrical electrode (19) is coaxially provided on a bearing shaft (7) and the energy is coupled in capacitively, via the rotary capacitor formed by the electrode (19) and the shaft (7).

17 Claims, 3 Drawing Sheets

FEED THROUGH FOR APPLICATION OF HF ENERGY

FIELD AND BACKGROUND OF THE INVENTION

The present invention relates to a feed trough and to a method for transmitting HF or RF energy through the wall of a gas tight treatment chamber, in particular a vacuum chamber, and to a rotatable, at least partially electroconductive carrier for at least one workpiece to be treated, as well as to the use thereof and to a vacuum treatment plant with a vacuum chamber and a feed trough.

Various treatment methods are known wherein a workpiece to be treated is introduced into a treatment chamber which is gas tight with respect to the atmosphere and, in order to be treated uniformly depending on the treatment process considered, is moved in the chamber by rotating a workpiece carrier. In particular, a procedure is known for use during a vacuum treatment process in a vacuum chamber where, at least as part of the treatment process, a high-frequency gas discharge is involved, such as a high-frequency ion etching process, a high-frequency sputtering process or an HF substrate bias process, for example.

For such processes or partial processes a feed trough must be provided for applying the high-frequency energy to the electroconductive rotating carrier or to the electroconductive parts thereof, while maintaining vacuum tight conditions. In this connection it is known to apply the high-frequency energy through wiper contacts to a bearing shaft for the carrier, but this entails various disadvantages. If the shaft traverses the gas tight chamber envelope, i.e. generally the wall thereof, a dynamic gas seal, in particular a dynamic vacuum seal, must be provided there. The wiper contact can then be placed outside the chamber, so that abrasion, which is never completely avoidable, does not effect the conditions inside the chamber. However, the layout of a gas tight, especially a vacuum tight dynamic seal is then a problem if the shaft diameter is relatively large, i.e. a limit is set for the shaft dimension. On the other hand, if the wiper contact is provided inside the chamber, i.e. under the conditions prevailing therein, the abrasion referred to causes contamination in the treatment chamber, which in many cases cannot be tolerated. In addition, the electrical load of such a vacuum contact is restricted to much narrower limits due, for example, to the problem of cooling.

In principle, providing wiper contacts, whether lying inside or outside the chamber, is critical for the feeding of HF energy, especially when high energies must be transmitted.

SUMMARY OF THE INVENTION

It is an object of the present invention to eliminate these disadvantages.

Accordingly, a further object of the present invention is to provide a feed trough for the application of HF or RF energy through a wall of a as tight treatment chamber and to a rotatable carrier in the chamber which is at least partially electroconductive and for carrying at least one workpiece to be treated, comprising a shaft mounted to the carrier and mounted for rotation with respect to the wall, so as to form a rotatable carrier arrangement, bearing means for electrically insulating the rotatable carrier arrangement relative to the wall for rotatably receiving said arrangement, an electrically insulating HF lead stationarily mounted with respect to the wall, and a first capacitor electrode electrically connected to the lead and fixed relative to the wall, the first electrode being spaced from an area of the arrangement being electroconductive and being electroconductively connected to the carrier which area defines a second capacitor electrode, the first and second electrodes forming a rotary capacitor for applying HF energy from the lead to the shaft and the carrier.

In principle, therefore, the HF transmission occurs capacitively between parts which are stationary relative to the chamber walls and parts which rotate with the carrier. Precisely because of the gas conditions being clearly defined in the chamber in most cases, the transmission capacitance arrangement is provided preferably inside the chamber, because there the flash-over resistance is clearly defined and is, in particular under vacuum, substantially better than outside the chamber.

Although it is perfectly possible to provide radially extending flange plates on the bearing shaft for the carrier, as one of the capacitance electrodes, which extend in an electrically insulated manner, along a corresponding fixed plate electrode to form the capacitor, it is preferred to design the rotary capacitor as a cylindrical capacitor. The advantage of this is that the axial positioning of the shaft relative to the fixed electrode is much less of a problem with a cylindrical capacitor than with the above-mentioned plate capacitor construction, since axial position tolerances have little influence on the capacitance, in contrast to the afore-said plate capacitor. This also facilitates axial installation and removal without requiring disassembling of the capacitor electrodes, which as a rule are of nested or staggered-plate design because of the required capacitance-value and are preferably cut from one piece.

Preferably seal and especially vacuum-seal conditions are provided at the outer wall of the chamber.

It is in many cases desirable not to be limited with respect to the support shaft diameter by dynamic seals. Where the gas tight or vacuum tight condition is obtained at the outermost stationary border of the chamber, i.e. in the outer wall thereof, it is possible to provide in the wall, dynamic seals of small diameter, if any are needed at all, even if in major sections inside the chamber the shaft has larger diameter.

According to another feature of the invention it is further proposed to arrange the shaft fully inside the chamber, that is, including its end which is spaced away from the carrier. The "chamber" thus generally includes all space in which the gas conditions intended for the treatment process prevail. Then, by means of a dynamic seal again which is much smaller than the shaft diameter, e.g. a pinion can be passed through the outer chamber wall, acting e.g. on a toothed rim on the shaft to rotate the shaft. The seal conditions are especially simplified if the chamber is, in particular in the region of the feed trough through the wall, not only vacuum tight but is hermetically closed only statically, in that for example the shaft lies fully in the chamber and the shaft is acted upon by means of a contactless drive, such as a magnetic drive, through the statically sealed wall.

Preferably the shaft is formed as a hollow shaft. This has the following advantages: for many treatment processes, such as HF sputtering or an HF substrate-bias process, it is desirable to monitor the treatment process in the chamber, or in other cases it may be desirable additionally to influence the treatment process, in general there is thus a need to provide signal generators and/or signal sensors in the chamber, for which purpose the center of the rotatable workpiece carrier is an especially favorable location in the chamber.

Since in a preferred embodiment the area forming the second electrode is disposed on or forms the wall of the shaft, in order to provide as large as possible a coupling capacitance for the HF energy, the shaft diameter is as large as possible, and since the sealing problems can readily be solved, whether statically or dynamically, and independently of the shaft diameter, as mentioned, it is possible according to the invention to install an appropriate device in or at this hollow shaft, and lines such as for power supply, pickoff signals, etc. can be passed through the shaft.

It should be remembered in this connection that the hollow shaft rotates and is preferably fully located inside the chamber here also. If, therefore, the hollow shaft is tubular and lies fully inside the chamber, that is, including its two ends, a stationary support arm preferably originating from the wall which carries a device or directly such stationary devices can be provided in the hollow shaft. Lines for this device are carried in or at the stationary arm. This requires no additional dynamic seals, except possibly for smaller dynamic seals for the shaft drive or of the device provided in the hollow shaft. Even if the support arm itself is designed as a hollow tube, e.g. to bring a probe with its leads into the chamber, a static seal is sufficient here also for sealing the chamber against the environment.

Instead of a device of the cited kind, the mentioned fixed hollow tube may have attached to it a viewing glass, for optical monitoring the process.

For reasons of occurring stray capacitances between the feed trough and the normally grounded chamber wall, and because of the line inductances, it is further desirable that the lead length to the stationary electrode of the rotary capacitor be as short as possible. For this reason it is proposed to choose the shortest possible path for this line, i.e. to arrange the lead radially to the axis of the shaft.

For some of the mentioned treatment processes it is further desirable to measure the electric potential of the workpiece carrier at least from time to time, as in particular for high-frequency ion etching, where the DC potential occurring at the carrier is informative e.g. as to the stability or instability of the gas discharge.

A device for tapping of the electrical potential of the carrier, preferably being selectively, as desired, feedable to and from the shaft is also provided according to the present invention, latter in particular, in order to avoid a permanent friction contact at the rotating shaft. Preferably a contact to be established at the shaft manually or by a drive is provided in order to monitor in particular DC potential at long or short intervals of time.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
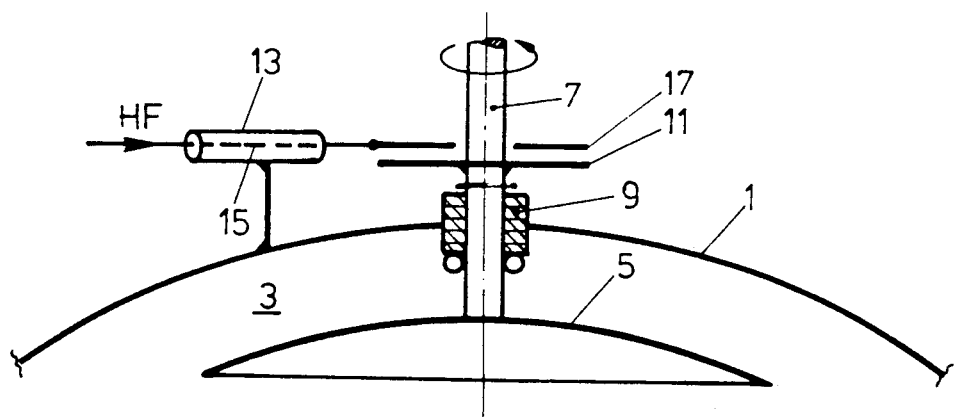
FIG. 1 is a schematic detail view of a vacuum chamber with a skullcap-shaped workpiece carrier and a feed trough according to a first embodiment of the present invention for transmitting HF or RF energy.

FIG. 1 shows a detail of a chamber wall 1 which delimits a chamber 3 from the outside environment. In chamber 3 a workpiece (not shown) is treated under gas conditions differing from the environment atmosphere, in particular, for vacuum processes, under a vacuum. The workpiece is suspended from below to a workpiece carrier 5 which is here skullcap- or dome-shaped, and the workpiece is treated from below, for example by high-frequency ion etching, RF or HF ion sputtering. The workpiece carrier 5 is mounted on an electroconductive shaft 7 for rotation relative to the chamber wall 1, as represented schematically by an insulating and gas tight radial/axial bearing 9. According to the invention, as embodied in FIG. 1, a radially projecting conductive collar 11 is electrically and mechanically connected to shaft 7 as well as to carrier 5, in a DC-connection.

An HF lead 15 is fixed relative to wall 1 and is provided with a coaxial cable whose outer conductor 13 is connected to wall 1. The lead 15 is DC-connected to a conductive circular ring plate 17 disposed in the immediate vicinity of collar 11. Thereby there is formed between ring plate 17 and collar 11 a rotary capacitor whose capacitance is constant during rotation of the shaft at least substantially, i.e. apart from untrue running caused by the suspension of the shaft.

The high-frequency energy is transmitted via lead 15 and the rotary capacitor 11, 17 to the rotating shaft 7 and hence to the workpiece carrier 5. Reflux of the HF current occurs capacitively form the carrier 5 to the normally grounded wall 1 of chamber 3 and through the discharge itself.

As can be seen from FIG. 1, the capacitance of the rotary capacitor depends essentially on the axial position of shaft 7.

Figure 2:
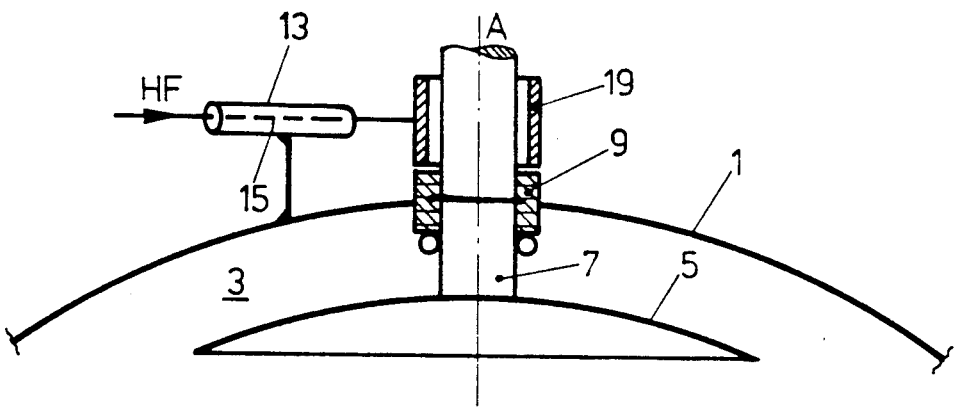
FIG. 2 is a representation which is analogous to FIG. 1 showing a second embodiment of the feed trough with a preferred electrode arrangement.

FIG. 2 shows a variant of the rotary capacitor at the feed trough for HF energy according to the invention which is preferred with respect to the electrode arrangement.

Parts which correspond to those explained with reference to FIG. 1 bear the same reference symbols.

Here the HF lead 15 is connected to a cylinder 19 which acts as a capacitance electrode disposed coaxially to the axis A of shaft 7, so that a cylindrical capacitor is formed between cylinder 19 and the section of shaft 7 lying in the zone of cylinder 19. The mechanical construction of such a cylindrical capacitor is less critical than that of the plate capacitor 11, 17 shown in FIG. 1.

In FIG. 1 and 2, the rotary capacitor 11, 17 or 7, 19 provided according to the invention lies outside chamber 3. This entails the problem that shaft 7 must be passed through wall 1 in a dynamically and gas tight manner and in particular according to the invention the fact that clearly defined gas conditions and hence conditions with respect to dielectric strength prevail in chamber 3 is not utilized.

Figure 3A:
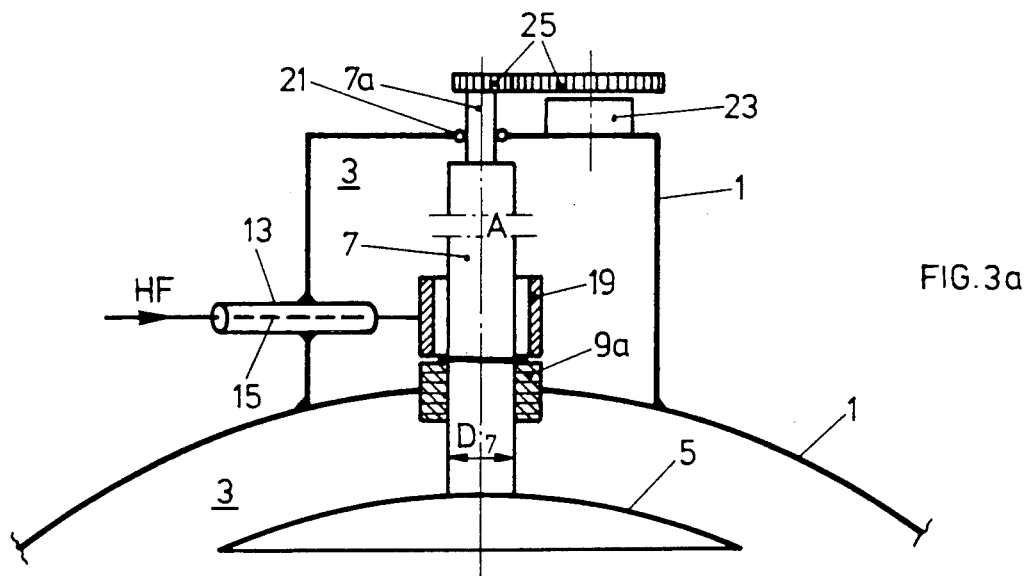
FIGS. 3a to 3c are views similar to FIG. 1 showing three different drive types for a carrier at a feed trough according to the invention, the variants illustrated in FIG. 3b and 3c being preferred at present as they permit free passage of a transport arm through a hollow shaft.
Figure 3B:
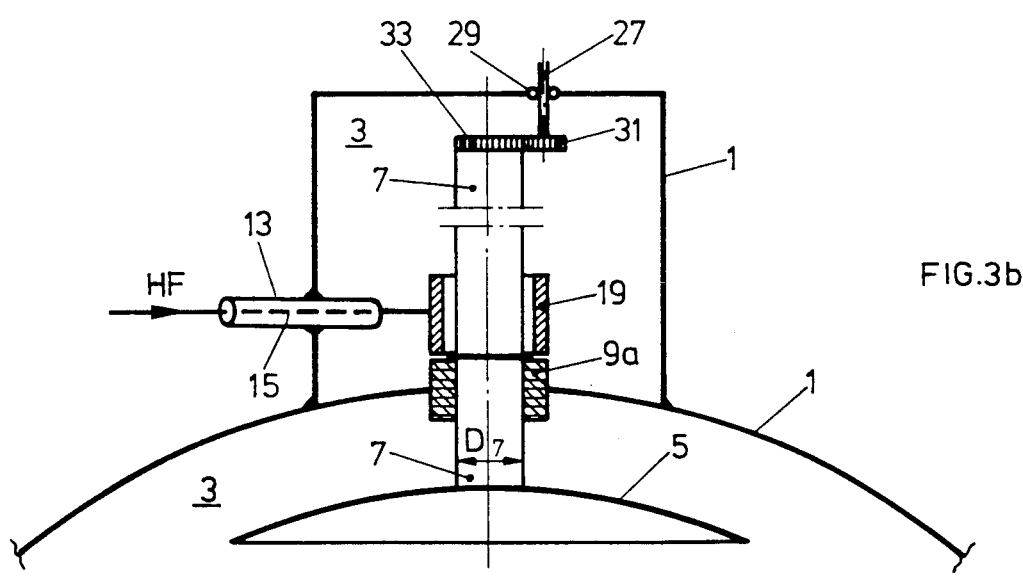
Figure 3C:
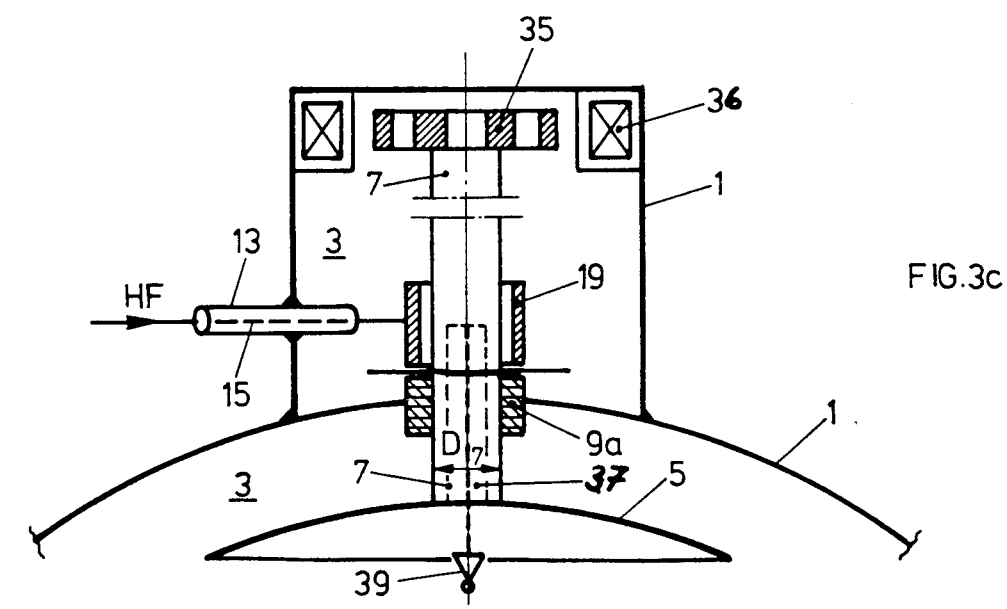

FIGS. 3a to 3c schematically illustrate three variants of the invention which are more favorable than those shown in FIGS. 1 and 2, the variants of FIGS. 3b and 3c being at present preferred.

Again, parts that are equivalent to parts in FIGS. 1 and 2 are provided with the same reference numbers.

According to FIG. 3a, the end of shaft 7 has a greatly reduced diameter, to form a driving axle neck 7a. This neck 7a is passed through a dynamic gas seal 21, and in the particularly considered case of a vacuum chamber 3, a dynamic vacuum seal, through wall 1. Seal 21 is small in relation to the diameter $D_7$ of the rest of shaft 7. Owing to this small diameter dynamic vacuum seal 11, the radial/axial bearing 9 provided in FIG. 1 and 2 must still be insulating, but not longer need it be gas tight. For this reason it is marked 9a in FIGS. 3a to 3c. The zone containing the rotary capacitor 7, 19 used according to the invention now resides in the environment of chamber 3, i.e. the gas conditions of the chamber, such as a vacuum which is installed in the chamber, prevail in the capacitor too. Carrier 5 is rotated in FIG. 3a by the axle neck 7a which extends out of wall 1 and out of chamber 3 and which is driven by a drive motor 23 via a gear arrangement 25.

As distinguished from the variant shown in FIG. 3a, according to FIG. 3b the shaft 7 lies fully in chamber 3. The drive occurs in that a pinion shaft 27 of much smaller diameter than the shaft diameter $D_7$ is passed through an also small dynamic gas or vacuum seal 29 and carries a pinion 31 at its end which acts on toothed rim 33 at shaft 7.

In FIG. 3c, shaft 7 again lies entirely in chamber 3. It carries a magnet rim 35, axially aligned with a rim of electromagnets 36 lying outside wall 1. The magnet arrangement 35, 36 thus forms a magnetic drive motor or magnetic coupling for shaft 7, but here only static seal precautions, if any, need be taken at wall 1 for the drive of shaft 7.

The shaft 7 in the preferred embodiments of FIGS. 3b or 3c, is preferably designed as a hollow shaft with a cavity 37 which, however, is shown only in FIG. 3c. The cavity 37 makes it possible to mount a sensor arrangement and/or generator arrangement 39, shown only schematically, as the shaft diameter $D_7$ can be chosen freely, in particular because of the absence of dynamic vacuum seals to be fitted to this dimension. Thus this arrangement 39 can readily be installed in cavity 37.

Figure 4:
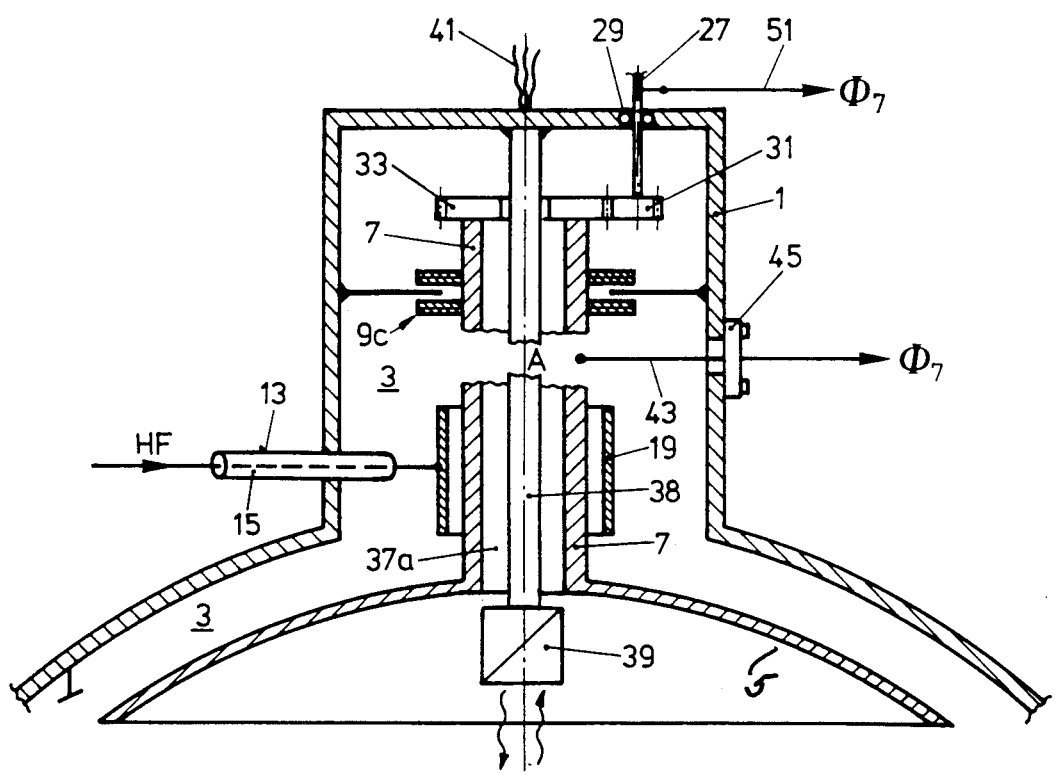
FIG. 4 is a sectional view of a further preferred variant of the rotary feed trough according to the invention with instrument-carrying arm and electric pickoff for the carrier.

FIG. 4 shows another, presently preferred variant of the feed trough according to the invention. Parts equivalent to those described before are again provided with the same numbers.

Shaft 7 is here mounted for rotation above the rotary capacitor 7, 19 and is insulated electrically relative to wall 1, as represented at 9c. The cavity 37a of the hollow shaft 7 extends through the entire shaft 7 lying wholly inside the chamber 3. An instrument support arm 38 is aligned with the axis A of shaft 7 and protrudes from the wall 1 into the cavity 37a and is illustrated by way of example, through this cavity 37a. Thus a signal generator and/or pickup arrangement 39, to be mounted on the support arm 38, is also fixed or stationary in chamber 3. Leads, such as power cables, signal conduction cables, etc. to the sensor/generator arrangement 39 can readily be passed through the fixed support arm 38 to the respective sensor and/or generator 39, as indicated by 41. The sensor/generator arrangement 39 with its leads through arm 38 is in itself gas tight, in particular vacuum tight. Arm 38 may itself be a part of a signal sensor or generator or, in the form of a tube, contain a viewing glass for optical monitoring the process within the chamber 3.

Although in FIG. 4 the drive of carrier 5 is analogous to that of FIG. 3b. In another variant of the arrangement a drive according to FIG. 3c may be provided in FIG. 4.

As can further be seen from FIG. 4, in wall 1 of chamber 3 an electric tap 43 is provided which is connectable to the shaft. In its simplest form and as shown schematically at 43, the tap can be screwed in and out of the wall 1 and can be sealed and insulated with respect thereto. By selective connection of tap 43 for measuring the electric potential $O_7$ to shaft 7 and hence electrically to the workpiece carrier 5, a wiper contact at shaft 7 with its known danger of contamination of the chamber atmosphere, can be avoided. If it is desired to measure the electric potential of shaft 7 permanently, an electroconductive connection can be established via the toothed rim 33, pinion and pinion shaft 31, 27 to the outside, which is insulated relative to the wall so that outside the chamber the potential can be tapped with high resistance, as indicated at 51. Bringing out the potential $O_7$ can alternatively occur contactlessly, such as capacitively.

The described feed trough according to the invention is employed preferably for vacuum treatment processes in a vacuum chamber 3, in particular for HF ion etching and/or HF spraying of workpieces and/or HF substrate bias processes or in processes in which these HF gas discharge processes are partial processes.

While the specific embodiments of the invention have been shown and described in detail to illustrate the application of the principles of the invention, it will be understood that the invention may be embodied otherwise without departing from such principles.

What is claimed is:

1. An apparatus for treating workpieces in a vacuum using an RF gas discharge, comprising:

wall means defining a vacuum chamber;

a carrier arrangement within said chamber for carrying workpieces to be treated, said carrier arrangement having an electroconductive surface area;

a shaft rotatably mounted to said wall means, said carrier arrangement being mounted on said shaft;

an RF energy feed from outside said vacuum chamber into said vacuum chamber;

a first electroconductive circular electrode surface in said vacuum chamber and connected to said RF energy feed;

a second electroconductive circular electrode surface arranged coaxially to and on said shaft, and being electroconductively connected to said electroconductive surface area of said carrier arrangement; and said first circular electrode surface being spaced from and arranged along said second circular electrode surface so that said second circular electrode surface moves along said first circular electrode surface as said carrier arrangement rotates with said shaft so as to lead RF energy from said RF energy feed to said electroconductive surface area of said carrier arrangement for said RF gas discharge.

2. The apparatus of claim 1, wherein said first electrode surface and said second electrode surface together form a cylindrical capacitor.

3. The apparatus of claim 1, wherein said shaft is completely inside said vacuum chamber.

4. The apparatus of claim 1, wherein said shaft is a hollow shaft having an open end, said carrier arrangement being mounted to said open end of said shaft.

5. The apparatus of claim 4, further comprising at least one of: sensing means, signal generating means, and a viewing window, disposed within said hollow shaft and communicating through said open end with said vacuum chamber.

6. The apparatus of claim 5, wherein said at least one of said: sensing means, signal generating means, and viewing window, is disposed within said hollow shaft and is stationary with respect to said wall means of said vacuum chamber.

7. The apparatus of claim 4, further comprising a stationary support arm extending into said hollow shaft for mounting at least one of: sensing means, signal generator means, and viewing means; for communicating through said open end of said hollow shaft with said vacuum chamber.

8. The apparatus of claim 1, wherein said shaft is entirely within said vacuum chamber.

9. The apparatus of claim 1, wherein said RF energy feed is arranged radially with respect to said shaft.

10. The apparatus of claim 1, further comprising means for tapping off an electric potential of said electroconductive surface area of said carrier arrangement.

11. The apparatus of claim 10, wherein said means for tapping off are selectively feedable towards and from an electroconductive contact area connected to said electroconductive surface area of said carrier arrangement.

12. The apparatus of claim 1, wherein said first and second circular electrode surfaces are formed as respectively staggered electrode surfaces.

13. The apparatus of claim 1, wherein one end of said shaft is connected to drive means for rotation of said shaft, said carrier arrangement being mounted to the other end of said shaft.

14. The apparatus of claim 13, including a gear mounted at said one end of said shaft, said drive means comprising gear means engaged with said gear on said shaft.

15. The apparatus of claim 14, wherein said shaft comprises at said one end a shaft portion of reduced diameter, said shaft portion of reduced diameter leading through a portion of said wall means, said gear being mounted on said reduced diameter shaft portion outside said vacuum chamber.

16. The apparatus of claim 14, wherein said shaft and said gear mounted at said one end are entirely positioned within said vacuum chamber and wherein said drive means includes a driving shaft provided for said gear means, said driving shaft for said gear means extending from outside said vacuum chamber through said wall means and into said vacuum chamber.

17. The apparatus of claim 16, wherein said wall means includes means for dividing said vacuum chamber into a compartment and a treatment chamber, a bearing rotatably mounting said shaft between said one end and said other end thereof, to said means for dividing said vacuum chamber, said one end of said shaft with said gear and said gear means being in said compartment and said other end of said shaft with said carrier arrangement being in said treatment chamber.

* * * * *